United States Patent
Kettinger et al.

(10) Patent No.: US 11,624,793 B2
(45) Date of Patent: Apr. 11, 2023

(54) METHOD FOR ACQUIRING MEASUREMENT DATA USING A MAGNETIC RESONANCE SYSTEM WITH CORRECTION OF K-SPACE TRAJECTORIES

(71) Applicant: Siemens Healthcare GmbH, Erlangen (DE)

(72) Inventors: Adam Kettinger, Bayern (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/383,526

(22) Filed: Jul. 23, 2021

(65) Prior Publication Data

US 2022/0026512 A1    Jan. 27, 2022

(30) Foreign Application Priority Data

Jul. 24, 2020 (DE) .......................... 102020209382.2

(51) Int. Cl.
*G01V 3/00* (2006.01)
*G01R 33/48* (2006.01)
(Continued)

(52) U.S. Cl.
CPC ....... *G01R 33/4824* (2013.01); *G01R 33/385* (2013.01); *G01R 33/543* (2013.01); *G01R 33/5608* (2013.01); *G01R 33/5611* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 8,981,776 B2    3/2015 Setsompop et al.
2005/0264288 A1*    12/2005 Campagna ....... G01R 33/56375
                                                              324/309
(Continued)

FOREIGN PATENT DOCUMENTS

DE    102017222359 A1    6/2019

OTHER PUBLICATIONS

Vannesjo et al., "Gradient System Characterization by Impulse Response Measurements with a Dynamic Field Camera," Magnetic Resonance in Medicine, vol. 69, pp. 583-593 (2013).
(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

In a method for acquiring measurement data using a magnetic resonance (MR) system having a gradient unit, frequency-dependent parameters characterizing the gradient unit of the MR system are accessed (e.g. loaded from a memory), a k-space trajectory of a RESOLVE (Readout Segmentation Of Long Variable Echo trains) sequence planned for a MR measurement is accessed, MR measurement data is acquired based on the planned k-space trajectory and reconstructing image data from the MR measurement data, and an electronic signal is provided that represents the reconstructed image data as an output of the MR system. The k-space trajectory may have a frequency component in at least one direction. The planned k-space trajectory may be corrected based on at least one frequency component of the planned k-space trajectory and the frequency-dependent parameters.

16 Claims, 5 Drawing Sheets

(51) Int. Cl.
G01R 33/561 (2006.01)
G01R 33/56 (2006.01)
G01R 33/54 (2006.01)
G01R 33/385 (2006.01)

(58) Field of Classification Search
USPC .......................................................... 324/309
See application file for complete search history.

(56) References Cited

U.S. PATENT DOCUMENTS

| | | | | |
|---|---|---|---|---|
| 2008/0205730 | A1* | 8/2008 | Stehning | G01R 33/3415 |
| | | | | 382/131 |
| 2014/0091795 | A1* | 4/2014 | Grodzki | G01R 33/288 |
| | | | | 324/309 |
| 2018/0074148 | A1* | 3/2018 | Pfeuffer | G01R 33/546 |
| 2018/0136298 | A1* | 5/2018 | Wilm | G01R 33/56518 |
| 2018/0356487 | A1* | 12/2018 | Liu | G01R 33/56545 |
| 2019/0178965 | A1 | 6/2019 | Paul et al. | |
| 2020/0278412 | A1 | 9/2020 | Paul et al. | |

OTHER PUBLICATIONS

Porter et al., "High Resolution Diffusion-Weighted Imaging Using Readout-Segmented Echo-Planar Imaging, Parallel Imaging and a Two-Dimensional Navigator-Based Reacquisition," Magnetic Reosnance in Medicine, vol. 62, pp. 468-475 (2009).

Stich et al., "Gradient waveform pre-emphasis based on the gradient system transfer function," Magnetic Resonance in Medicine, vol. 80, pp. 1521-1532 (2018).

Vannesjo et al., "Image Reconstruction Using a Gradient Impulse Response Model for Trajectory Prediction," Magnetic Resonance in Medicine, vol. 76, pp. 45-58 (2016).

Bilgic et al., "Wave-CAIPI for Highly Accelerated 3D Imaging," Magnetic Resonance in Medicine, vol. 73, No. 6, pp. 2152-2162 (2015).

Gagoski et al., "RARE/Turbo Spin Echo Imaging with Simultaneous Multislice Wave-CAIPI," Magnetic Resonance in Medicine, vol. 73, pp. 929-938 (2015).

Breuer et al., "Controlled Aliasing in Parallel Imaging Results in Higher Acceleration (CAIPIRINHA) for Multi-Slice Imaging," Magnetic Resonance in Medicine, vol. 53, No. 3, pp. 684-691 (2005).

S. Vannesjo, "Doctoral Thesis, Characterizing and Correcting for Imperfect Field Dynamics in Magnetic Resonance Imaging," ETH—ZÜRICH, pp. 9-23, 136-147 (2013).

Setsompop et al., "Blipped-Controlled Aliasing in Parallel Imaging for Simultaneous Multislice Echo Planar Imaging with Reduced g-Factor Penalty," Magnetic Resonance in Medicine, vol. 67, pp. 1210-1224 (2012).

Cauley et al., "Autocalibrated Wave-CAIPI Reconstruction; Joint Optimization of k-Space Trajectory and Parallel Imaging Reconstruction," Magnetic Resonance in Medicine, vol. 78, No. 3, pp. 1093-1099 (2016).

Chen et al., "Self-Calibrating Wave-Encoded Variable-Density Single-Shot Fast Spin Echo Imaging," Journal of Magnetic Resonance Imaging (2017).

* cited by examiner

METHOD FOR ACQUIRING MEASUREMENT DATA USING A MAGNETIC RESONANCE SYSTEM WITH CORRECTION OF K-SPACE TRAJECTORIES

CROSS REFERENCE TO RELATED APPLICATIONS

This patent application claims priority to German Patent Application No. 10 2020 209 382.2, filed Jul. 24, 2020, which is incorporated herein by reference in its entirety.

BACKGROUND

Field

The disclosure relates to a method for acquiring measurement data by means of a magnetic resonance system with correction of the k-space trajectories used, in particular using a RESOLVE (REadout Segmentation Of Long Variable Echo trains) sequence.

Related Art

Magnetic resonance technology (in the following description, the abbreviation MR stands for magnetic resonance) is a well-known modality by means of which images of the interior of an examination subject can be generated. To put it simply, the examination subject is positioned for this purpose in a magnetic resonance device in a comparatively strong, static, homogeneous basic magnetic field, also referred to as the $B_0$ field, at field strengths of 0.2 tesla to 7 tesla and more, such that the nuclear spins thereof are aligned along the basic magnetic field. In order to trigger nuclear spin resonances measurable as signals, radiofrequency excitation pulses (RF pulses) are radiated into the examination subject, the triggered nuclear spin resonances are measured as so-called k-space data, and MR images are reconstructed or spectroscopic data determined on the basis thereof. Rapidly switched magnetic gradient fields, called gradients for short, are superimposed on the basic magnetic field for the purpose of spatially encoding the measurement data. A used scheme that describes a time sequence of RF pulses to be applied and gradients to be switched is referred to as a pulse sequence (scheme), or also as a sequence for short. The recorded measurement data is digitized and stored as complex numeric values in a k-space matrix (also referred to as "k-space" for short). An associated MR image can be reconstructed from the value-filled k-space matrix e.g. by means of a multidimensional Fourier transform.

A well-known pulse sequence is the so-called RESOLVE sequence, as described e.g. for the first time in the article by Porter and Heidemann titled "High Resolution Diffusion-Weighted Imaging Using Readout-Segmented Echo-Planar Imaging, Parallel Imaging and a Two-Dimensional Navigator-Based Reacquisition", MRM 62, 2009, pp. 468-475. The RESOLVE sequence is a variant of an EPI-like sequence (EPI=Echo Planar Imaging) in which, in contrast to conventional EPI methods, a segmentation is performed in the readout direction instead of in the phase encoding direction. A RESOLVE sequence may be combined with a diffusion preparation and/or with navigator measurements.

Generally speaking, in a RESOLVE sequence, a diffusion preparation by means of a prephasing gradient is followed by specification of that segment of the k-space that is to be filled with measurement data in the following readout phase. In the readout phase, a train of echo signals is acquired as measurement data for the specified segment by means of a sinusoidal readout gradient. By means of a further gradient that has an opposite polarity to the prephasing gradient and can be switched directly after the readout phase, a return can be made in the readout direction back to the k-space center before a further refocusing pulse can be applied, which leads to the formation of further echo signals that are acquired as navigator data of the k-space center by means of a navigator readout gradient. The acquired navigator data may be used to compensate for possible phase changes between the acquisition of the measurement data in the individual segments, as described in greater detail in the article by Porter and Heidemann already cited above.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

Figure 1:
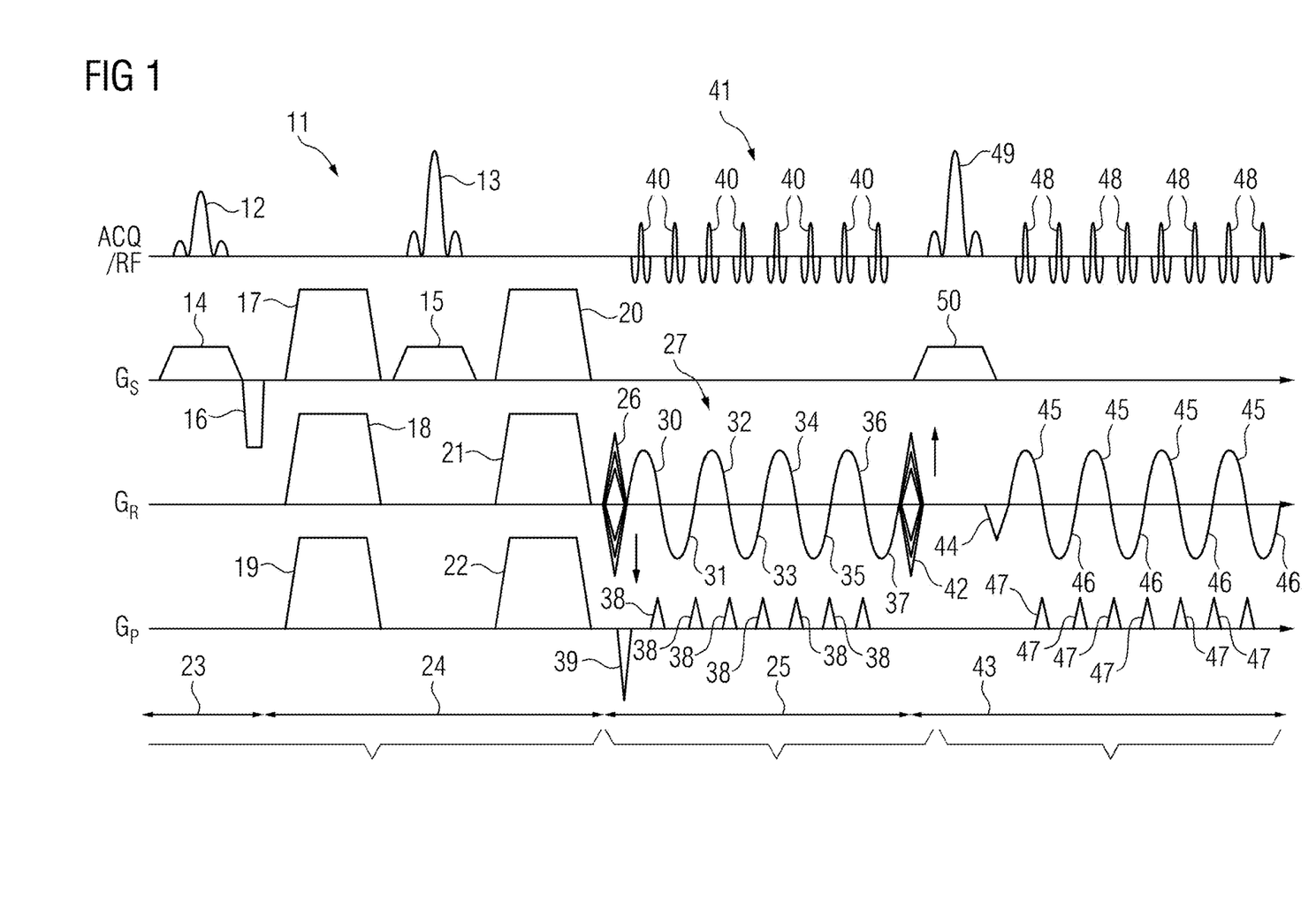
FIG. 1 a plot of a RESOLVE pulse sequence scheme according to an exemplary embodiment.

FIG. 1 shows a schematic view of a part of a RESOLVE pulse sequence scheme 11 depicting gradients to be switched and RF pulses to be applied in their time sequence.

A diffusion preparation block comprises an RF excitation pulse 12, during the application of which a slice selection gradient 14 is switched in the slice selection direction $G_S$, and an RF refocusing pulse 13, during the application of which a slice selection gradient 15 is switched. The slice selection gradients serve to select a slice in an examination subject in which echo signals are to be excited and read out as measurement data. In addition, a rephasing gradient 16 can be switched in the slice selection direction in order to compensate for possible dephasings of the excited spins due to the slice selection gradient 14. Diffusion gradients 17, 18, 19 and 20, 21, 22 of the diffusion preparation block are switched in the usual manner before and after the RF refocusing pulse 13, respectively.

The RF excitation pulse 12 and the associated slice selection gradient 14 and rephasing gradient 16 can be assigned to an excitation phase 23 of the pulse sequence scheme, the excitation phase 23 being followed by an evolution phase 24 that lasts up to the completion of the diffusion gradients 20, 21, 22.

The diffusion preparation block is followed by a readout phase 25 which comprises a prephasing gradient 26 in the readout direction $G_R$. The prephasing gradient 26 defines that segment of the k-space that is to be filled with measurement data in the following readout time window since it specifies the start coordinate of the readout trajectory in the k-space in the readout direction. The different segments in the readout direction $G_R$, such as are depicted e.g. in FIG. 2, can be read out by varying the moment of the prephasing gradient 26 in different repetitions of the pulse sequence.

The prephasing gradient 26 is followed in the readout direction $G_R$ by a sinusoidal readout gradient 27 that comprises a plurality of arcs 30, 31, 32, 33, 34, 35, 36, 37. Each of the arcs 30-37 encodes a section along the readout direction $G_R$ in the k-space.

Phase encoding gradients 38 switched in the phase encoding direction $G_P$, also referred to as "blips", shift the encoding incrementally in the phase encoding direction such that an EPI-typical readout trajectory is obtained in segments by means of the readout gradient 27 and the phase encoding gradients 38.

Like the prephasing gradient 26 in the readout direction, a first phase encoding gradient 39 of the readout phase 25 specifies the start coordinate of the readout trajectory in the k-space in the phase encoding direction.

In the readout phase 25, the generated echo signals 40, preferably all echo signals 40 belonging to a segment, are acquired in a readout window. The echo signals 40, which are excited by means of an excitation phase 23, form an echo train 41. After the last echo 40 of the echo train 41 has been acquired at the end of the readout phase 25, the encoding in the readout direction can be brought back to the k-space center again by means of a further gradient 42 that has an opposite polarity to the prephasing gradient 26.

The readout phase 25 is followed by a navigator phase 43 in which gradients 44, 45 and 47 are switched that operate analogously to the gradients switched in the readout phase, only one segment usually being read out in the navigator phase. The echo signals 48 are generated following application of an RF refocusing pulse 49 with switching of a slice selection gradient 50.

Figure 2:
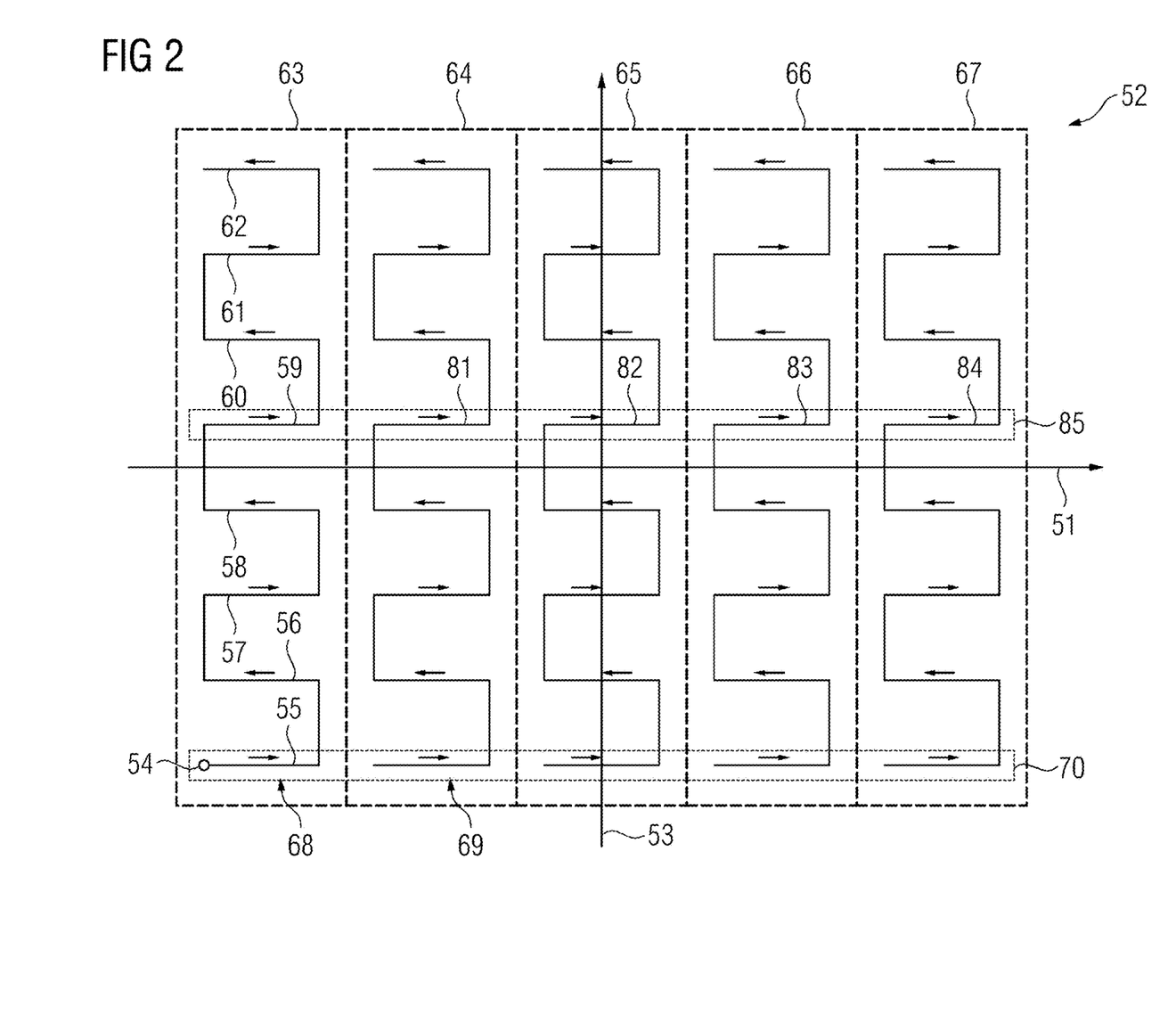
FIG. 2 a sampling scheme in k-space, according to an exemplary embodiment, achievable using a RESOLVE pulse sequence scheme according to FIG. 2.

FIG. 2 shows an example of a sampling scheme in the k-space that can be realized using a RESOLVE pulse sequence scheme according to FIG. 1. Herein, the axis 51 shows by way of example the kx direction, and the axis 53 shows the ky direction. The kx direction corresponds here to the readout direction and the ky direction to the phase encoding direction.

Following a preparation of the spins, e.g. a diffusion preparation by means of diffusion gradients 17, 18, 19, 20, 21, 22, a first start point 54 for sampling a segment 63 can be specified by means of the gradients 26 and 39. The partial k-space line 55 is acquired while the arc 30 of the readout gradient 27 is switched. The partial k-space line 56 is acquired while the arc 31 of the readout gradient 27 is switched. The shift in the phase encoding direction lying between the partial k-space lines 55 and 56 is achieved by switching a blip 38.

The further partial k-space lines 57, 58, 59, 60, 61 and 62 are acquired analogously during switching of the arcs 32, 33, 34, 35, 36 and 37. The partial k-space lines 55 to 62 each correspond to an echo signal 40 and form an echo train 41.

The partial k-space lines 55 to 62 cover the segment 63 of the k-space 52 segmented by way of example into the segments 62 to 67 in the readout direction.

If the pulse sequence scheme 11 is applied by means of a dephasing gradient 26 having a different gradient moment, echo signals of another of the segments 64, 65, 66 or 67 of the k-space 52 can be acquired. In this case, the (zeroth) moment of a switched prephasing gradient 26 should correspond to a multiple (corresponding to the arrangement of the segment) of the (zeroth) moment (only the term "moment" is used hereafter) of an arc 32-37 of the readout gradient 27, since a discrepancy between the moments of the prephasing gradient 26 and an arc 30-37 of the readout gradient 27 leads to so-called ringing artifacts when the echo signals 40 acquired as measurement data in the individual segments are combined.

If an echo train 41 comprises all echo signals 40 that are to be acquired for a segment 63 to 67, as many excitation cycles are switched in total as segments are provided, in order to acquire all echo signals 40 of all segments 63 to 67.

If an echo train 41 acquires only a portion of the echo signals 40 to be acquired for a segment 63 to 67, correspondingly more excitation cycles must be switched. The k-space may in this case be referred to as also segmented in the phase encoding direction.

In the example shown, the trajectories 68 and 69 (in the segments 63 and 64) are represented with a certain spacing in the readout direction. This serves simply for greater clarity of illustration. In actual fact, echo signals may be acquired in such a way that overall no gaps are produced in the acquired k-space in the readout direction, so that overall complete, albeit segmented, k-space lines may be sampled in the readout direction. The partial k-space lines contained in the fields 70 and 85 marked by way of example are then supplemented to form a full k-space line in each case.

The moment of the readout gradient is the determining factor in order to avoid the aforementioned ringing artifacts, and consequently to improve the image quality of RESOLVE measurements. To avoid ringing artifacts of said type, it is already known to adjust the moments of the arcs 30-37 of a readout gradient 27 of a RESOLVE sequence by multiplication with an adjustment factor, which typically lies in a range of approx. 0.995 to 1.025. The adjustment factor may be dependent on the magnetic resonance system used for a measurement, in particular on its hardware specifications and configurations, on the premises in which the magnetic resonance system is located, and/or on the sequence parameters used, such as e.g. the echo spacing and/or the orientation of the switched gradients.

The adjustment factor suitable for a measurement must be determined by means of calibration measurements. A method for determining adjustment factors of said type by means of calibration measurements is described in, for example, DE102017222359. A correction of possible time shifts is not possible by means of such an adjustment factor.

For a calibration of the aforesaid type, it is generally necessary to vary different parameters, such as e.g. the adjustment factor itself, but also the echo spacing and the orientation of the gradients and parameters describing the hardware of the magnetic resonance system used, and to compare the image data resulting from using the respective adjustment factors in respect of its quality and level of artifact severity in order to optimize the calibration. The calibration measurements may therefore be time-consuming and computationally expensive. Typically, such a determination of an adjustment factor is therefore performed once only (e.g. following installation of a magnetic resonance system or even once only for each type of magnetic resonance system in order not to prolong the installation times on account of the calibration measurements) and the obtained adjustment factor is specified as a fixed multiplier. Such a procedure is therefore not necessarily specific to individual magnetic resonance systems and furthermore is lacking in flexibility, as well as being unable to compensate for subsequently occurring changes or fluctuations, including those specific to an examination subject.

An object of the disclosure is to avoid artifacts, in particular ringing artifacts, within the context of RESOLVE measurements.

The disclosure is based among other things on the following insight: A focus of investigation in the last several years has been on system-specific functions called gradient impulse response functions (GIRFs). These relate to interactions between the individual gradient fields generated by the gradient coils. In other words, GIRFs describe the impact of the gradient axes on one another when, for example, a gradient generated on a first axis affects the gradient curves of at least one further axis, which leads to deviations between planned and actually applied gradients. The causes for this lie e.g. in the coil geometry, through which the coils mutually influence one another inductively, and in the electronic signal paths.

In order to obtain information about the behavior of gradient units, methods have been developed to determine said GIRFs. For example, in the article by Signe Johanna Vannesjo et al. titled "Gradient System Characterization by Impulse Response Measurements with a Dynamic Field Camera," Magnetic Resonance in Medicine 69, 2013, pp. 583-593, a method is described for recording GIRFs with the aid of field cameras.

Theoretically, it is possible to determine the gradient actually realized by the gradient unit from a known GIRF of a gradient unit and from a nominal, planned gradient (in its variation with time) by means of a convolution of the GIRF with a nominal, planned gradient. However, convolutions of said type are associated with high computational overhead.

For k-space trajectories having a frequency component, in which gradients switched during a readout phase and specifying the k-space trajectory have at least one frequency component in each case, such as e.g. sinusoidal readout gradients, a compute-intensive convolution can be dispensed with.

A method for acquiring measurement data, according to an exemplary embodiment, using a magnetic resonance system having a gradient unit, includes: loading frequency-dependent parameters characterizing the gradient unit of the magnetic resonance system,
loading a k-space trajectory of a RESOLVE sequence planned for a magnetic resonance measurement, said trajectory having a frequency component in at least one direction,
acquiring magnetic resonance measurement data based on the planned k-space trajectory and reconstructing image data from the magnetic resonance measurement data, wherein the planned k-space trajectory is corrected on the basis of at least one frequency component of the planned k-space trajectory and the characterizing parameters,
storing and/or displaying the reconstructed image data.

The method according to the disclosure permits a correction of k-space trajectories specified by means of switched gradients, and consequently an avoidance of artifacts, in a simple manner requiring little computational overhead as a function of a frequency component of a planned k-space trajectory and with knowledge of the behavior of the gradient unit used, in particular the response of the latter to a request for generating desired gradient fields. By virtue of the thus generated frequency dependence of the correction, the correction may be employed in a flexible manner for k-space trajectories having different frequency components. Complex and time-consuming calibration measurements can be dispensed with.

GIRFs describe the behavior of gradient units, are relatively simple to determine and possess a frequency dependence. Accordingly, they are well-suited for the method as frequency-dependent parameters characterizing the gradient unit.

A magnetic resonance system according to the disclosure comprises a magnet unit, a gradient unit, a radiofrequency transceiver, and a controller embodied to perform a method according to the disclosure and having a correction unit.

A computer program according to the disclosure implements a method according to the disclosure on a controller when the program is executed on the controller.

The computer program may in this case be present also in the form of a computer program product which can be loaded directly into a memory of a controller and has program code means for performing a method according to the disclosure when the computer program product is executed in the computing unit of the computing system.

An electronically readable data medium according to the disclosure comprises electronically readable control information stored thereon which comprises at least one computer program according to the disclosure and is embodied in such a way that it performs a method according to the disclosure when the data medium is used in a controller of a magnetic resonance system.

The advantages and explanatory statements recited in relation to the method apply analogously also to the magnetic resonance system, the computer program product and the electronically readable data medium.

Figure 3:
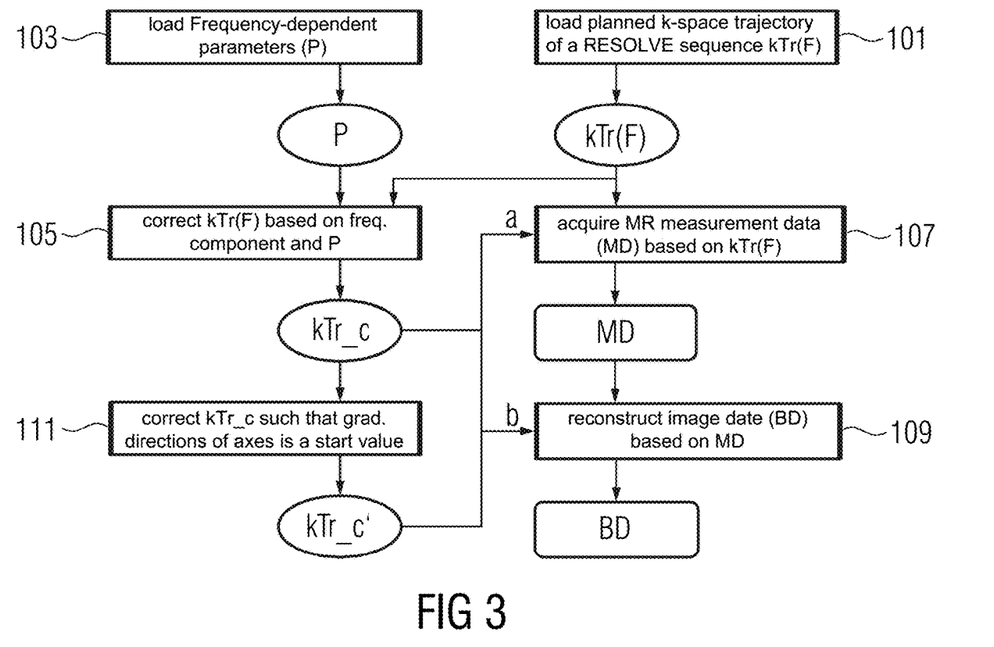
FIG. 3 a flowchart of a method according to an exemplary embodiment.

FIG. 3 is a schematic flowchart of a method according to the disclosure for acquiring measurement data using a magnetic resonance system having a gradient unit.

In the method, at least one planned k-space trajectory of a RESOLVE sequence kTr(F) is loaded, which k-space trajectory has at least one frequency component F (block 101). Loading planned k-space trajectories comprises in particular a loading of those gradient fields $G_S$, $G_R$, $G_P$ which nominally lead to the desired planned k-space trajectory, which for example samples a RESOLVE segment in the k-space. Such gradient fields to be switched and associated k-space trajectories have already been presented above with reference to FIGS. 1 and 2. The frequency component of the k-space trajectory is either known or can be derived from a frequency at which gradients to be switched for the planned k-space trajectory change.

The gradients used for the spatial encoding of the signals measured in a readout phase are generally generated as gradient fields on the orthogonal axes x, y, and z, the z-direction being defined in most cases as pointing in the direction of the main magnetic field and extending in the slice selection direction $G_S$. The gradient fields in the readout direction $G_R$, in the phase encoding direction $G_P$ and in the slice selection direction $G_S$ are generated by means of three gradient coils, each of which generates a field in the x-, y- and z-direction of the gradient unit. The same applies to the gradients switched during a navigator phase.

Frequency-dependent parameters P characterizing the gradient unit of the magnetic resonance system are also loaded (block 103), e.g. from a memory. The loaded characterizing parameters P describe in particular interactions between gradient fields generated by the respective gradient coils, which gradient fields are e.g. influenced by the geometry of the gradient coils and describe the behavior of a gradient unit, in particular the response of the latter to a request for the generation of desired gradient fields.

The loaded frequency-dependent parameters characterizing the gradient unit may be based on measured gradient impulse response functions (GIRFs). The GIRFs may have been determined e.g. by means of sensors, such as field cameras, or also by means of dedicated measurements performed on the magnetic resonance system.

It is not necessary here to load all characterizing parameters present for the gradient unit of the magnetic resonance system, but it may be sufficient to load characterizing parameters for at least one gradient coil of the gradient unit corresponding to an axis of the gradient unit, in particular for that axis or those axes for which the planned k-space trajectory kTr(F) has a frequency component F.

Figure 4:
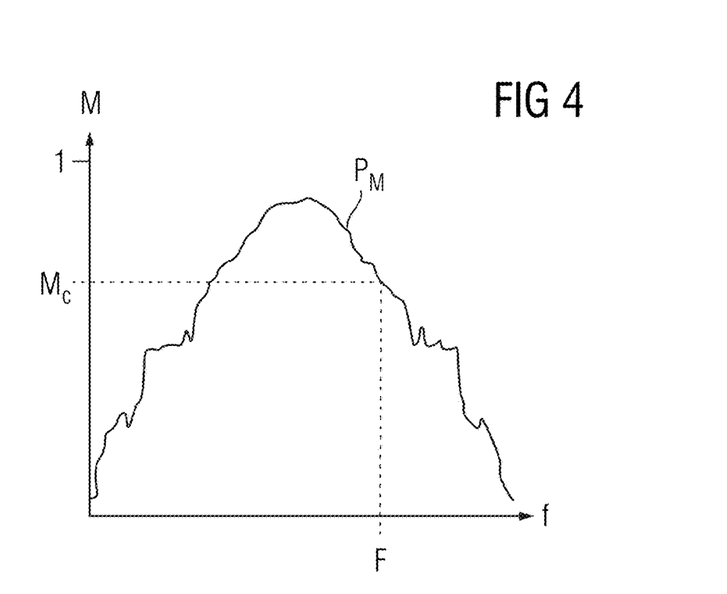
FIG. 4 a plot of a first frequency-dependent parameter characterizing a gradient unit of a magnetic resonance system, according to an exemplary embodiment.

FIG. 4 shows an exemplary representation of a first frequency-dependent parameter $P_M$ characterizing, e.g. for one axis, a gradient unit of a magnetic resonance system. The parameter $P_M$ specifies for example a response curve of a magnitude M (amplitude) attained by the gradient unit of a gradient field generated thereby in the frequency plane f, and shows by way of example a typical lowpass filter characteristic. The parameter $P_M$ may have been determined based on parameters P describing a behavior of a gradient unit, such as e.g. a GIRF measured on the gradient unit, by means of a Fourier transform into the frequency plane and consideration of the magnitude of the result of the Fourier transform.

Figure 5:
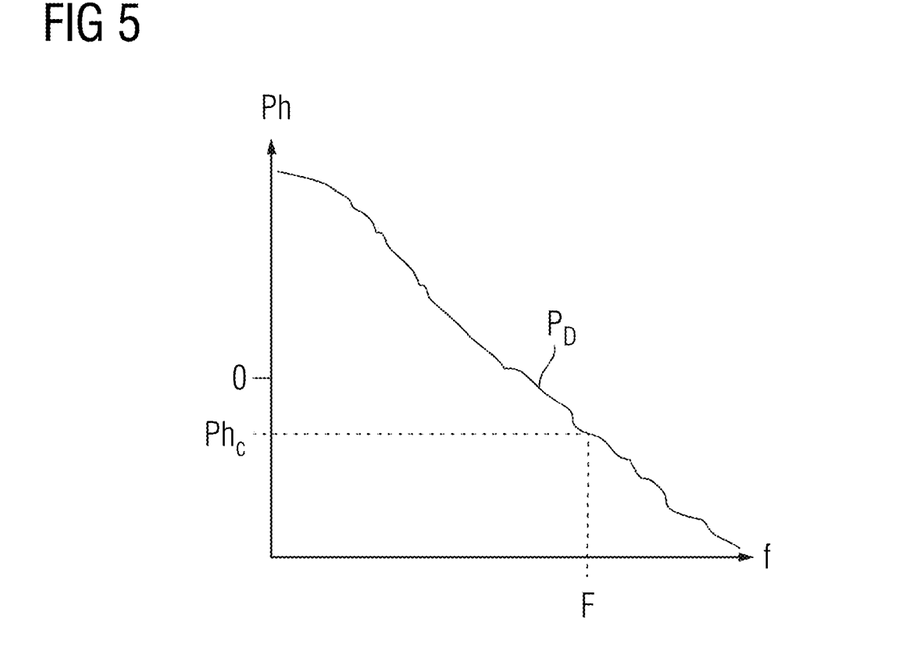
FIG. 5 a plot of a second frequency-dependent parameter characterizing a gradient unit of a magnetic resonance system, according to an exemplary embodiment.

FIG. 5 shows an exemplary representation of a second frequency-dependent parameter $P_D$ characterizing a gradient unit of a magnetic resonance system, e.g. for one axis. The parameter $P_D$ specifies for example a response curve of a phase Ph attained by the gradient unit of a gradient field generated thereby in the frequency plane f. The parameter $P_D$ may have been determined for example based on parameters P describing a behavior of a gradient unit, such as e.g. a GIRF measured on the gradient unit, by means of a Fourier transform into the frequency plane and consideration of the phase of the result of the Fourier transform.

Magnetic resonance measurement data MD is acquired (block 107) based on the planned k-space trajectory kTr(F).

Image data BD is reconstructed (block 109) from the acquired magnetic resonance measurement data MD.

The planned k-space trajectory kTr(F) is corrected (block 105) on the basis of the at least one frequency component F of the planned k-space trajectory kTr(F) and the loaded characterizing parameters. The result of the correction is a corrected k-space trajectory kTr_c.

For the correction of the planned k-space trajectory kTr (F), those readout gradients that have a frequency component F of the planned k-space trajectory kTr(F) may be corrected. Accordingly, the correction of the planned k-space trajectory k-Tr(F) may be performed in each case in the direction of an axis of the gradient unit corresponding to a gradient direction, for which the characterizing parameters used are applicable.

If characterizing parameters for all axes of the gradient unit were loaded in block 103, the correction 105 of the planned k-space trajectory kTr(F) may be performed in each of the directions of an axis of the gradient unit.

Figure 6:
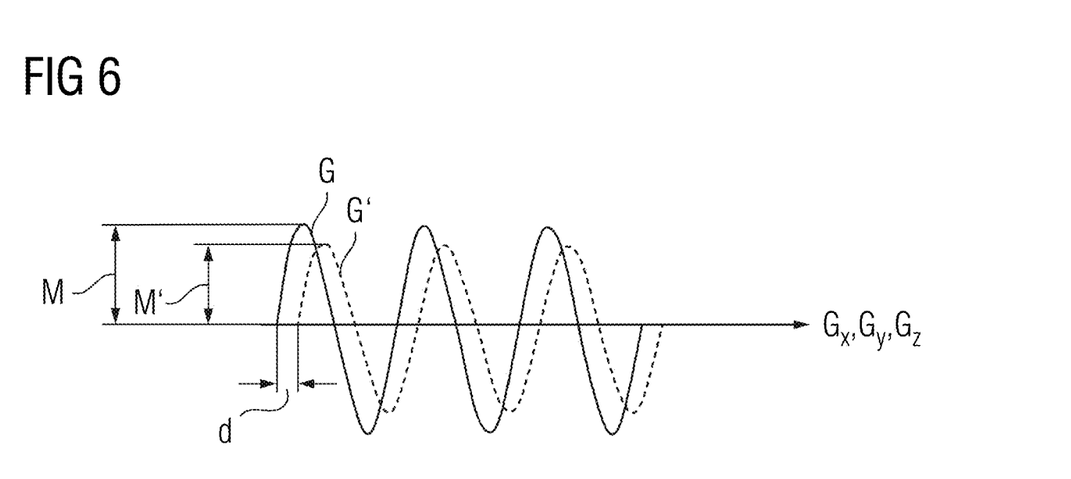
FIG. 6 a plot of a comparison of a gradient of a planned k-space trajectory having a frequency component and a corrected gradient of a corrected k-space trajectory determined based on parameters characterizing a gradient unit used and the planned k-space trajectory, according to an exemplary embodiment.

FIG. 6 schematically shows a juxtaposition of a gradient G of a planned k-space trajectory having a frequency component and a corrected gradient G' of a corrected k-space trajectory determined on the basis of parameters characterizing a gradient unit used and of the planned k-space trajectory, e.g. in a gradient direction Gx, Gy, Gz corresponding to one of the axes x, y, z of the gradient unit.

The gradient G of the planned k-space trajectory and the corrected gradient G' of the corrected k-space trajectory have different magnitudes and are offset in time relative to one another. In the example shown, the gradient G of the planned k-space trajectory has a maximum magnitude M and the corrected gradient G' of the corrected k-space trajectory has a (smaller) magnitude M'. The response curve of the corrected gradient G' may also start with a time delay d compared to the gradient G, as shown. The frequency component as well as the total duration of the response curves of the gradient G and of its corresponding corrected gradient G' remain the same.

The value of the magnitude M' of the corrected gradient of the corrected k-space trajectory may be determined on the basis of the value of the magnitude M of the gradient of the planned k-space trajectory and a parameter $P_M$ describing attained magnitudes in the frequency plane and characterizing the gradient unit used using the frequency component F of the planned k-space trajectory. In this case, in order to determine the value of the magnitude M' of the corrected gradient, the value of the parameter $P_M$ describing attained magnitudes, which corresponds to the frequency component F of the planned k-space trajectory, may simply be multiplied by the magnitude M of the gradient G of the planned k-space trajectory.

In FIG. 4, an example of a value $M_c$ of the parameter $P_M$ corresponding to a frequency component F is shown in the drawing for the depicted possible response curve of a parameter $P_M$ describing attained magnitudes in the frequency plane f. For this case, the following would therefore apply: $M'=M*M_c$.

The method therefore permits a correction of deviations in the magnitude simply from knowledge of parameters P characterizing the gradient unit used as a function of the known frequency component F of the k-space trajectory used, for which hardly any computational overhead is necessary.

The value of the time delay d of the corrected gradient of the corrected k-space trajectory may be determined on the basis of the value of the frequency component and a parameter $P_D$ describing attained phases in the frequency plane and characterizing the gradient unit used using the frequency component F of the planned k-space trajectory. In this case, in order to determine the value of the delay d of the corrected gradient, the absolute amount of the value of the parameter $P_D$ describing attained phases, which corresponds to the frequency component F of the planned k-space trajectory, may simply be divided by the value of the frequency component F.

In FIG. 5, an example of a value $Ph_c$ of the parameter $P_D$ corresponding to a frequency component F is shown in the drawing for the depicted possible response curve of a parameter $P_D$ in the frequency plane f describing attained phases. For this case, the following would therefore apply: $d=abs(Ph_c)/F$.

The method therefore permits a correction of time delays simply from knowledge of parameters P characterizing the gradient unit used as a function of the frequency component F of the k-space trajectory used, for which hardly any computational overhead is necessary.

The corrected k-space trajectory kTr_c, which is easily derivable via the corrected gradient G', may therefore be determined from the planned k-space trajectory kTr(F) with little computational overhead on the basis of the at least one frequency component F of the planned k-space trajectory and a value associated with the frequency component F of a loaded characterizing parameter P, in particular from parameters $P_M$ and $P_D$ describing attained magnitudes and phases and derivable from parameters P describing a behavior of a gradient unit.

The k-space trajectory kTr_c corrected in such a way in gradient directions corresponding to axes of the gradient unit may be used as start value for a further correction (block 111). For example, a further correction 111 may include an alignment to a tilting of axes x', y', z' of a planned measurement range relative to the gradient axes x, y, z of the magnetic resonance system. A tilting of said type means that at least one of the axes x', y' and z' does not correspond to the gradient axes x, y, z. The correction values determined for the gradient axes x, y, z may be converted, e.g. by means of interpolation, into correction values for the axes x', y', z'.

The correction 105 of the planned k-space trajectory kTr(F) on the basis of the frequency component F and the characterizing parameters P may be performed before the magnetic resonance measurement data MD is acquired, with the result that the magnetic resonance measurement data MD is acquired along corrected k-space trajectories kTr_c (FIG. 1, branch a).

The further correction 111 of the planned k-space trajectory kTr(F) may also be performed before the magnetic resonance measurement data MD is acquired, with the result that the magnetic resonance measurement data MD is acquired along corrected k-space trajectories kTr_c' (FIG. 1, branch a).

An acquisition 107 of the measurement data MD along corrected k-space trajectories kTr_c or kTr_c' corresponds to a prospective correction. For this purpose, the planned k-space trajectory kTr(F) may be modified in such a way that the corrected k-space trajectory kTr_c or kTr_c' used in the acquisition of the measurement data MD corresponds to the actually desired k-space trajectory.

If, for example, the k-space trajectory kTr_c corrected on the basis of the frequency component F and the characterizing parameters P is to be used during the acquisition 107 of the measurement data MD, the planned k-space trajectory kTr(F) may be modified by anticipating the correction 105 of the planned k-space trajectory such that the corrected k-space trajectory kTr_c obtained as a result of the correction 107 corresponds to the k-space trajectory wanted for the acquisition 107 of the measurement data MD. Analogously to the example described with reference to FIGS. 4 and 6, a magnitude M of a gradient G of a modified planned k-space trajectory M having a frequency component F may therefore be determined by dividing the (desired) magnitude M' of the corrected gradient G' by the value of the parameter $P_M$ describing attained magnitudes, which corresponds to the frequency component F of the planned k-space trajectory.

The following would apply: $M=M'/M_c$.

Analogously to the example described with reference to FIGS. 5 and 6, a time (pre-)delay d of a gradient G of a modified planned k-space trajectory M having a frequency component F may therefore be determined by bringing forward the (desired) start time of the planned k-space trajectory by the determined value for d.

Corrected k-space trajectories kTr_c or kTr_c' may be used in the reconstruction 109 of the image data BD in order to avoid reconstruction errors based on deviations of gradients actually generated in the course of a measurement during a readout time interval from the respective gradients planned for said readout time interval (FIG. 1, branch b). In this case, the correction 105 of the planned k-space trajectory kTr(F) and/or the further correction 111 of the planned k-space trajectory kTr(F) may be performed on the basis of the frequency component F and the characterizing parameters P after the magnetic resonance measurement data MD has been acquired.

Using corrected k-space trajectories kTr_c or kTr_c' within the scope of the reconstruction 109 of the image data BD is equivalent to a retrospective correction. Artifacts are avoided in the reconstruction 109 of the image data BD by using corrected k-space trajectories kTr_c or kTr_c' that correspond to the k-space trajectories actually generated by the gradient unit used.

A combination of prospective and retrospective correction is e.g. conceivable when k-space trajectories kTr_c corrected on the basis of the frequency component F and the characterizing parameters P are used for a prospective correction and further k-space trajectories kTr_c' corrected by means of a further correction 111 are used for a retrospective correction, and/or when e.g. a prospective correction is performed only for one or two of the gradient axes x, y and z, and a retrospective correction is performed for the gradient axis (axes) not treated by means of the prospective correction.

Intermediate results, as well as the reconstructed image data BD, may be stored and/or displayed.

Figure 7:
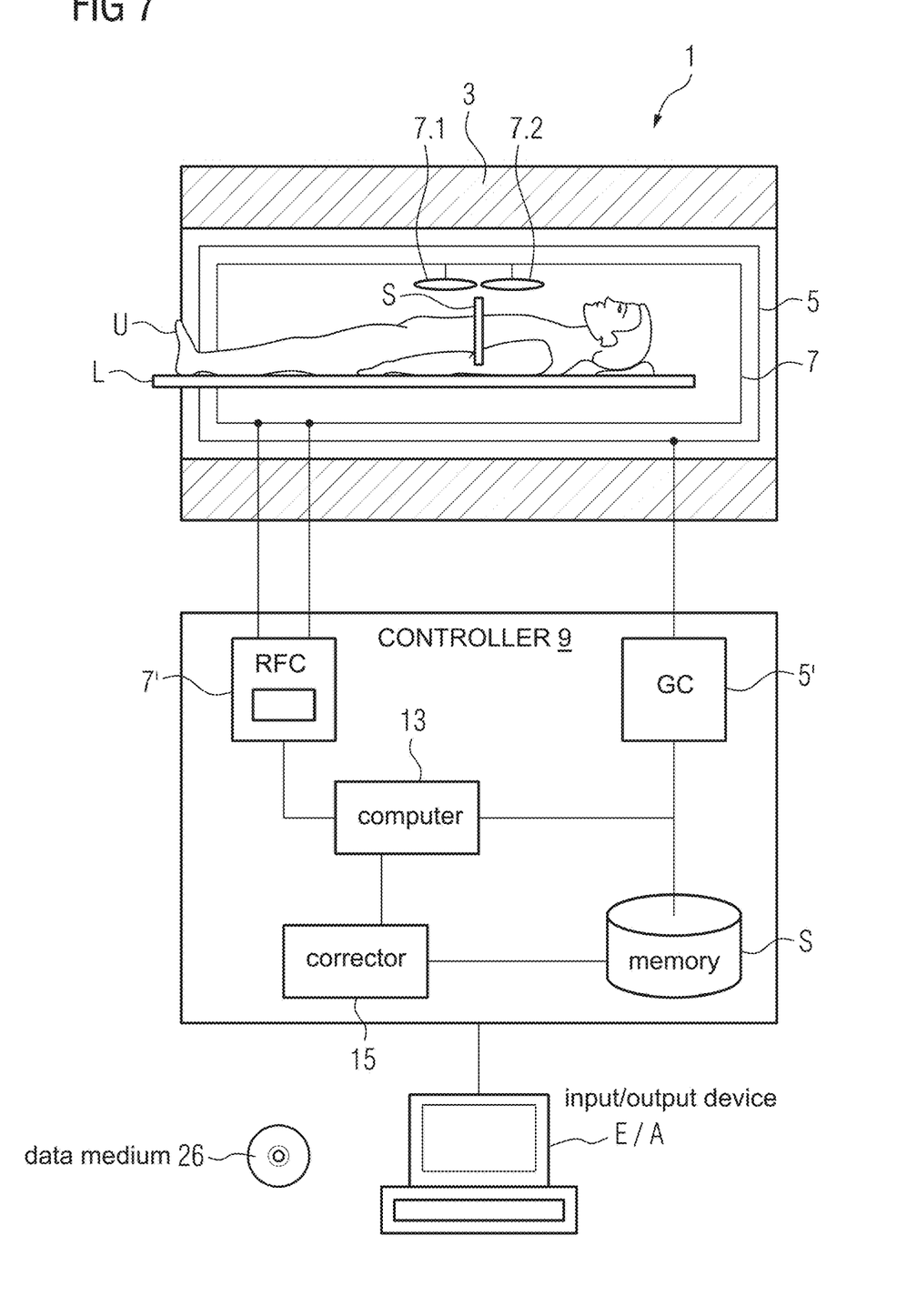
FIG. 7 a magnetic resonance system according to an exemplary embodiment.

FIG. 7 shows a schematic representation of a magnetic resonance (MR) system 1 according to the disclosure. This comprises a magnet unit 3 configured to generate the basic magnetic field, a gradient unit (gradient field generator 5 having e.g. three gradient coils acting in the x-, y-, and z-direction (not shown individually) for generating gradient fields, a radiofrequency (RF) transceiver 7 configured to transmit and receive radiofrequency signals, and a controller 9 configured to control the operation of the MR system 1 and/or perform a method according to the disclosure.

These subunits of the magnetic resonance system 1 are shown only in rough schematic form in FIG. 7. In an exemplary embodiment, the radiofrequency transceiver 7 includes a plurality of subunits, for example of a plurality of coils such as the schematically depicted coils 7.1 and 7.2 or more coils, which may be configured to transmit radiofrequency signals and/or receive the triggered radiofrequency signals.

In order to examine an examination subject U, for example a patient or a phantom, the subject can be introduced, positioned on a couch L, into the scanning volume of the magnetic resonance system 1. The slice or slab S represents an exemplary target volume of the examination subject, from which data is to be recorded and acquired as measurement data.

In an exemplary embodiment, the controller 9 is configured to control the magnetic resonance system 1 and may control in particular the gradient unit 5 by means of a gradient controller 5', and the radiofrequency transceiver 7 by means of a radiofrequency transceiver controller 7'. The radiofrequency transceiver 7 may in this case comprise a plurality of channels on which signals may be transmitted or received. In an exemplary embodiment, the controller 9 includes processing circuitry that is configured to perform one or more functions/operations of the controller 9. In one or more aspects, one or more of the components of the controller 9 may include processing circuitry that is configured to perform one or more respective functions/operations of the component(s).

The radiofrequency transceiver 7 is responsible together with its radiofrequency transceiver controller 7' for generating and applying (transmitting) a radiofrequency alternating field in order to manipulate the spins in a region that is to be manipulated (for example in slices S that are to be measured) of the examination subject U. In this case the center frequency of the radiofrequency alternating field, also referred to as the B1 field, is usually set as far as possible such that it lies near the resonance frequency of the spins that are to be manipulated. Deviations of the center frequency from the resonance frequency are referred to as off-resonance. In order to generate the B1 field, currents controlled by means of the radiofrequency transceiver controller 7' are applied at the RF coils in the radiofrequency transceiver 7.

The controller 9 additionally comprises a corrector 15 configured to perform a correction according to the disclosure. Overall, the controller 9 is configured to perform a method according to the disclosure.

A computing unit 13 encompassed by the controller 9 is embodied to perform all the computing operations required for the necessary measurements and determinations. Intermediate results and results required for this purpose or determined in this process may be stored in a memory unit S of the controller 9. The units shown are in this case not necessarily to be understood as physically separate units, but simply represent a subdivision into notional units, although these may also be realized e.g. in a small number of physical units or even in just one single physical unit.

Control commands may be directed, e.g. by a user, to the magnetic resonance system by way of an input/output device E/A of the magnetic resonance system 1 and/or results of the controller 9 such as e.g. image data may be displayed.

A method as described herein may also be present in the form of a computer program product which comprises a computer program and implements the described method on a controller 9 when it is executed on the controller 9. Similarly, an electronically readable data medium 26 on which electronically readable control information is stored may be present, which control information comprises at least one such computer program product as just described and is embodied in such a way that it performs the described method when the data medium 26 is used in a controller 9 of a magnetic resonance system 1.

To enable those skilled in the art to better understand the solution of the present disclosure, the technical solution in the embodiments of the present disclosure is described clearly and completely below in conjunction with the drawings in the embodiments of the present disclosure.

Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein. In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for acquiring measurement data using a magnetic resonance (MR) system having a gradient unit, the method comprising:
    loading frequency-dependent parameters characterizing the gradient unit of the MR system;
    loading a k-space trajectory of a RESOLVE (Readout Segmentation Of Long Variable Echo trains) sequence planned for a MR measurement, the k-space trajectory having a frequency component in at least one direction;
    acquiring MR measurement data based on the planned k-space trajectory and reconstructing image data from the MR measurement data, wherein the planned k-space trajectory is corrected based on at least one frequency component of the planned k-space trajectory and the frequency-dependent parameters; and
    providing an electronic signal representing the reconstructed image data as an output of the MR system.

2. A magnetic resonance (MR) system comprising:
    one or more gradient coils; and
    a controller configured to:
        access frequency-dependent parameters characterizing the one or more gradient coils;
        access a k-space trajectory of a RESOLVE (Readout Segmentation Of Long Variable Echo trains) sequence planned for a MR measurement, the k-space trajectory having a frequency component in at least one direction;
        control the MR system to acquire MR measurement data based on the planned k-space trajectory; and
        reconstruct image data from the MR measurement data, wherein the planned k-space trajectory is corrected based on at least one frequency component of the planned k-space trajectory and the frequency-dependent parameters.

3. The method as claimed in claim 1, wherein the frequency-dependent parameters are based on measured gradient impulse response functions (GIRFs).

4. The method as claimed in claim 1, wherein the frequency-dependent parameters are loaded for at least one axis of the gradient unit.

5. The method as claimed in claim 4, wherein the correction of the planned k-space trajectory is performed in each case in the direction of an axis of the gradient unit, for which the frequency-dependent parameters used are applicable.

6. The method as claimed in claim 1, wherein the correction of the planned k-space trajectory is performed before the MR measurement data is acquired, such that the MR measurement data is acquired along corrected k-space trajectories.

7. The method as claimed in claim 1, wherein the planned k-space trajectories are corrected after the acquisition of the MR measurement data.

8. The method as claimed in claim 1, wherein the frequency-dependent parameters are loaded for all axes of the gradient unit and the correction of the planned k-space trajectory is performed in each of the respective directions of the axes of the gradient unit.

9. The method as claimed in claim 1, wherein providing the electronic signal representing the reconstructed image data comprises storing and/or displaying the reconstructed image data.

10. A computer program product, embodied on a non-transitory computer-readable storage medium, including an executable program and which is directly loadable into a memory of the MR system, when executed by a processor of the MR system, causes the processor to perform the method as claimed in claim 1.

11. A non-transitory computer-readable storage medium with an executable program stored thereon, that when executed, instructs a processor to perform the method of claim 1.

12. The method as claimed in claim 1, wherein the frequency-dependent parameters include one or more interactions between gradient fields generated by the gradient unit.

13. The method as claimed in claim 1, wherein the frequency-dependent parameters include one or more interactions between gradient fields generated by respective gradient coils of the gradient unit.

14. The method as claimed in claim 13, wherein the frequency-dependent parameters describe an influence on respective geometries of the gradient coils on the gradient fields.

15. The method as claimed in claim 1, wherein the frequency-dependent parameters describe a response of the gradient unit to a request for a generation of one or more gradient fields by the gradient unit.

16. The MR system as claimed in claim 2, wherein the controller is further configured to generate an electronic output signal representing the reconstructed image data.

* * * * *